(12) United States Patent
Fujita et al.

(10) Patent No.: US 9,257,257 B2
(45) Date of Patent: Feb. 9, 2016

(54) ELECTRON BEAM CONTROL METHOD, ELECTRON BEAM GENERATING APPARATUS, APPARATUS USING THE SAME, AND EMITTER

(75) Inventors: Shin Fujita, Kyoto (JP); Mohamed El-Gomati, York (GB); Torquil Wells, York (GB)

(73) Assignees: SHIMADZU CORPORATION, Kyoto (JP); UNIVERSITY OF YORK HESLINGTON, York (GB)

( * ) Notice: Subject to any disclaimer, the term of this patent is extended or adjusted under 35 U.S.C. 154(b) by 1744 days.

(21) Appl. No.: 12/306,635

(22) PCT Filed: Jun. 30, 2006

(86) PCT No.: PCT/GB2006/050180
§ 371 (c)(1),
(2), (4) Date: Feb. 4, 2010

(87) PCT Pub. No.: WO2008/001030
PCT Pub. Date: Jan. 3, 2008

(65) Prior Publication Data
US 2010/0127170 A1    May 27, 2010

(51) Int. Cl.
*G01N 23/00* (2006.01)
*H01J 37/065* (2006.01)
*H01J 35/06* (2006.01)

(52) U.S. Cl.
CPC ............ *H01J 37/065* (2013.01); *H01J 35/06* (2013.01); *H01J 2201/196* (2013.01); *H01J 2237/06316* (2013.01); *H01J 2237/3175* (2013.01)

(58) Field of Classification Search
CPC ........... H01J 37/00; H01J 37/02; H01J 37/06; H01J 37/063; H01J 37/065; H01J 37/07; H01J 37/073; H01J 37/075

USPC .......................................... 250/306, 310, 311
See application file for complete search history.

(56) References Cited

U.S. PATENT DOCUMENTS

| 145,042 | A | 12/1873 | Bartlett |
| 145,043 | A | 12/1873 | Beecher |

(Continued)

FOREIGN PATENT DOCUMENTS

| EP | 0790633 | 8/1997 |
| EP | 0813221 | 12/1997 |

(Continued)

OTHER PUBLICATIONS
Fujita et al., "Theory of Cathode Trajectory Characterization by Canonical Mapping Transformation" J. Electron Microscopy, 54(4), 331-343 (2005).

(Continued)

*Primary Examiner* — Robert Kim
*Assistant Examiner* — Jason McCormack
(74) *Attorney, Agent, or Firm* — McDermott Will & Emery LLP

(57) ABSTRACT

Provided is a Schottky emitter having the conical end with a radius of curvature of 2.0 μm on the emission side of an electron beam. Since a radius of curvature is 1 μm or more, a focal length of an electron gun can be longer than in a conventional practice wherein a radius of curvature is in the range of from 0.5 μm to not more than 0.6 μm. The focal length was found to be roughly proportional to the radius of the curvature. Since the angular current intensity (the beam current per unit solid angle) is proportional to square of the electron gun focal length, the former can be improved by an order of magnitude within a practicable increase in the emitter radius. A higher angular current intensity means a larger beam current available from the electron gun and the invention enables the Schottky emitters to be used in applications which require relatively high beam current of microampere regime such as microfocus X-ray tube, electron probe micro-analyzer, and electron beam lithography system.

17 Claims, 13 Drawing Sheets

* R<0.5μm~0.6μm

(56) References Cited

U.S. PATENT DOCUMENTS

| | | | |
|---|---|---|---|
| 5,664,036 A * | 9/1997 | Islam | 385/31 |
| 5,834,781 A * | 11/1998 | Fukuhara | 250/423 F |
| 5,895,919 A | 4/1999 | Frosien et al. | |
| 6,051,839 A * | 4/2000 | Crewe | 250/396 ML |
| 6,479,819 B1 * | 11/2002 | Hamashima et al. | 250/310 |
| 6,627,889 B2 * | 9/2003 | Ochiai et al. | 850/9 |
| 7,058,161 B2 | 6/2006 | Inazuru | |
| 2002/0074495 A1 * | 6/2002 | Notte, IV | 250/311 |
| 2004/0026629 A1 * | 2/2004 | Fujieda et al. | 250/423 R |
| 2004/0159787 A1 * | 8/2004 | Nakasuji et al. | 250/311 |
| 2004/0222376 A1 * | 11/2004 | Sasaki et al. | 250/310 |
| 2005/0045821 A1 * | 3/2005 | Noji et al. | 250/311 |
| 2006/0113469 A1 * | 6/2006 | Baba et al. | 250/310 |
| 2006/0118719 A1 * | 6/2006 | Watanabe et al. | 250/310 |
| 2006/0169900 A1 * | 8/2006 | Noji et al. | 250/310 |
| 2006/0243908 A1 * | 11/2006 | Shinada et al. | 250/310 |

FOREIGN PATENT DOCUMENTS

| | | |
|---|---|---|
| JP | 06084450 A | 3/1994 |
| JP | 06084452 A | 3/1994 |
| JP | 08036981 A | 2/1996 |
| JP | 09-283068 A | 10/1997 |
| JP | 1074446 A | 3/1998 |
| JP | 10-188868 A | 7/1998 |
| JP | 20037195 A | 1/2003 |
| JP | 2003132826 A | 5/2003 |
| JP | 2005-339922 A | 12/2005 |

OTHER PUBLICATIONS

Tuggle D W, et al., "Point cathodes for use in virtual source electron optics", Journal of Microscopy UK, vol. 140, Dec. 1985, pp. 293-301.

Notification of Reasons for Refusal issued in Japanese Application No. 2009-517369 dated Feb. 12, 2013.

* cited by examiner

* R=2.0μm

* R<0.5μm~0.6μm

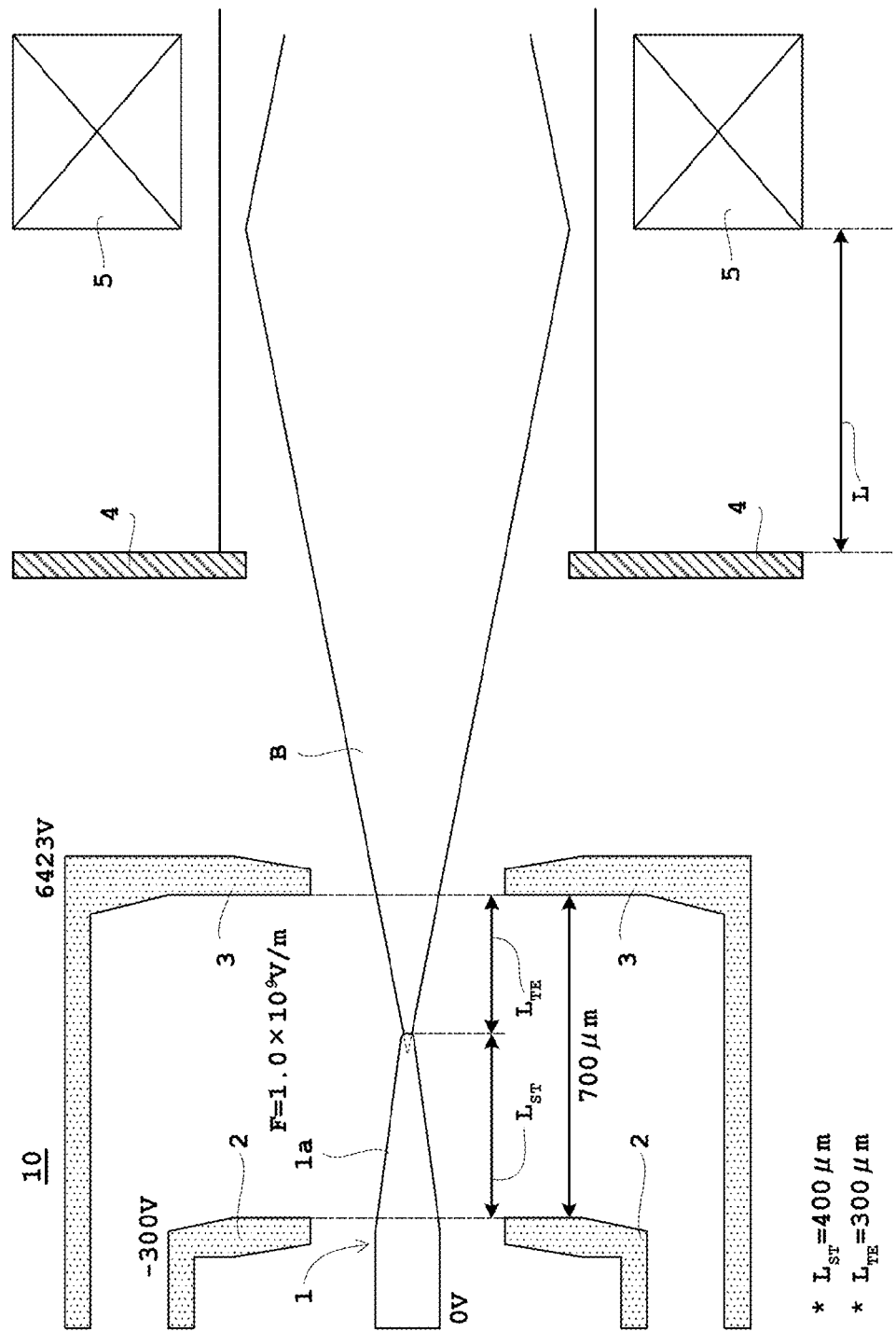

* R<0.5μm～0.6μm

ELECTRON BEAM CONTROL METHOD, ELECTRON BEAM GENERATING APPARATUS, APPARATUS USING THE SAME, AND EMITTER

CROSS-REFERENCE TO RELATED APPLICATIONS

This application is the national stage of PCT International Application No. PCT/GB2006/050180, filed on Jun. 30, 2006, which is hereby incorporated by reference in its entirety.

BACKGROUND OF THE INVENTION (1) Field of the Invention

The invention relates to an electron beam control method, an electron beam generating apparatus, a device using the same, and an emitter.

(2) Description of the Related Art

Electron guns in electron beam based instruments use two types of cathodes (emitters); a thermionic emitter and a field emitter. A thermionic emitter uses a tungsten filament, a pointed emitter of a single crystal or a sintered compound of lanthanum hexaboride ($LaB_6$) or cerium hexaboride ($CeB_6$). The emitter is heated and caused to emit thermal excited electrons to thereby generate an electron beam. A field emitter uses a sharpened conical end of an electrode on the emission side of an electron beam and emits electrons by using a tunneling effect or a Schottky effect caused by a strong electric field applied to the conical end to thereby generate an electron beam.

Note that in a case where an analysis or observation is carried out in a small region, an electron beam with a high brightness is required in order to reduce a diameter thereof (here, the "brightness" is defined as the current density per unit solid angle of the electron beam). Therefore, in recent years, a field emitter has been adopted, instead of a thermionic emitter that has been conventionally employed, in a scanning electron microscope (hereinafter also referred to as "SEM" for short) and an electron probe microanalyzer (hereinafter also referred to as "EPMA" for short) as well as other electron beam based instruments; transmission microscopy, electron beam lithography, inspection tools, etc. in analysis or observation in a small region to thereby improve a spatial resolution.

There are two types of field emitters, a cold field emitter and a thermal field emitter. In the case of a cold field emitter, the conical end of an emitter is normally made from a single crystal fine tungsten wire and is subjected to a strong electric field at room temperature whereby electrons, in the single crystal, are emitted using a tunneling effect, so that an electron beam is generated. In the case of a thermal field emitter, the conical end of an emitter made from a single crystal fine tungsten wire coated with zirconium oxide (ZrO) is heated while being subjected to a strong electric field which causes electrons to be emitted using a Schottky effect, so that an electron beam is generated. Since a thermionic emitter uses a Schottky effect as described above, it is also called a Schottky emitter.

In a Schottky emitter, a zirconium oxide layer coating the conical end of the emitter has an effect of reducing a work function of a crystal face, formed in the conical end, and which is a (100) crystal plane. Therefore, a uniform, strong electron beam is emitted and extracted from the conical end. Note that a Schottky emitter technology is disclosed in U.S. Pat. Nos. 145,042 and 145,043.

In the case of a field emitter, as described above, the current density is, however, higher than that of a thermionic emitter. In the case of a field emitter, the electron source diameter, where an electron beam is emitted from in an electron gun configuration, is very small, as shown in FIG. 9B, in comparison with a thermionic emitter of FIG. 9A (FIG. 9B shows a Schottky emitter). An electron source diameter is several tens of μm in a case of a thermionic emitter, while in a field emitter represented by a Schottky emitter, an electron source diameter is several tens of nm. If an electron source area of a thermionic emitter is indicated by $dS_{TE}$, and an electron source area of a field emitter is indicated by $dS_{FE}$, the areas are different from each other by up to six orders of magnitude.

On the other hand, if a solid angle of an electron beam is indicated by $d\Omega$ and a beam current value (current value is indicated by $I_b$), a solid angle $d\Omega$ of the electron beam varies according to a beam current value $I_b$ to be required. If an axial brightness of the electron beam is indicated by B, a beam current value $I_b$ is given by the following equation (1) with an electron source area dS and a solid angle $d\Omega$.

$$I_b = B \times (dS \times d\Omega) \qquad (1)$$

In a case where a larger beam current is necessary, it is understood from equation (1) that an effective solid angle $d\Omega$ increases for fixed brightness and source area.

A Schottky emitter is much higher in brightness than a thermionic emitter (by about three orders of magnitude). However, since an electron source area $dS_{FE}$ is smaller than $dS_{TE}$ by up to six orders of magnitude, a solid angle $d\Omega$ of an electron beam in a case where the same beam current is secured is larger in a Schottky emitter than that in a thermionic emitter. That is, if a solid angle of an electron beam in a thermionic emitter is indicated by $d\Omega_{TE}$ and a solid angle of an electron beam in a field emitter represented by a Schottky emitter is indicated by $d\Omega_{FE}$, a relation expressed by the following equation (2) is established.

$$d\Omega_{FE} > d\Omega_{TE} \qquad (2)$$

That is, an angular current density which is the current per unit solid angle for a Schottky emitter is smaller than that of a thermionic emitter although the Schottky emitter has a higher axial brightness than the thermionic emitter.

Since, with a larger solid angle, an electron beam is diverged, collimation is required. As a result, in a field emitter, an aberration in an accelerating and condenser lens section downstream from the emission side exerts a large influence, so that a characteristic of the emitter, which would be by nature high in brightness, is degraded by an influence of the aberration, and the "apparent brightness" decreases as a beam current increases. FIG. 10 is a graph showing relationships between a beam current value and brightness in the case where a Schottky emitter is employed as an example of a field emitter and the case where a tungsten filament emitter is employed as an example of a thermionic emitter. The abscissa is assigned to a beam current and the ordinate is used for plotting brightness. A dotted line is a curve concerning a tungsten filament emitter and a solid line shows a curve concerning a Schottky emitter. Note that in the Schottky emitter, the curve was obtained under the conditions where the emission current density $j_s$ is $1.0 \times 10^4$ A/cm$^2$, an emitter temperature T is 1800 K and an angular current density $J_{\Omega SE}$ is 0.429 mA/str, while for the thermionic emitter, the curve was obtained under the conditions where the emission current density $j_s$ is 3 A/cm$^2$, an emitter temperature T is 2800 K and an angular current density $J_{\Omega W}$=140 mA/str. The term "W filament" indicates the tungsten filament operated in the thermionic mode and the term "SE" indicates the Schottky emitter.

In a case of a thermionic emitter represented by a tungsten filament, the angular current density is high; therefore a decrease in brightness is not problematical in a practical aspect giving a reduced brightness when the current is in the neighborhood of a value in the range of 10 μA to 20 μA. On the other hand, in a case of a field emitter represented by a Schottky emitter, an angular current density is lower and an electron source diameter is smaller; therefore, the brightness begins to decrease when the beam current is in the neighborhood of 1 nA and the brightness decreases by 6 orders of magnitude at a beam current 1 μA.

Since a beam current employed in a case of a scanning electron microscope (SEM) is at a level of nA or less, no reduction in brightness is observed with a Schottky emitter in a case where the emitter is used in SEM. Thus, a Schottky emitter can be used in SEM. However, in a case of a device where a beam current at a level of sub μA or μA is required as in a electron probe micro analyzer (EPMA), reduction in the brightness is observed at a level of sub μA or μA for a Schottky emitter; therefore, even if a Schottky emitter is employed in instruments such as EPMA, only an electron beam with a low brightness can be used. Hence, it is impossible to employ a field emitter in instruments such as EPMA in a practical sense.

SUMMARY OF THE INVENTION

The invention has been made in light of such circumstances and it is an object of the invention to provide an electron beam control method, an electron beam generating apparatus, capable of freely setting the angular current density in a Schottky emitter.

The following findings and knowledge have been obtained in order to achieve such an objective.

As shown in FIG. 11A, a Schottky emitter 201 has a construction in which a conical end 201a of an emitter 201 on an emission side B of an electron beam is, as described above, sharpened in the shape of a cone. Note that FIG. 11B is a schematic diagram in which the conical end 201a thereof is enlarged and if a radius of curvature of the conical end 201a is indicated by R, R is in the range of R<0.5 μm to 0.6 μm.

Note that if trajectories of electron beams emitted from an electron gun (emitter) are called as "cathode trajectories", a primary characteristic of the cathode trajectories is characterized by electron gun focal length. (S. Fujita and H. Shimoyama, J. Electron Microscopy, 54(4), 331-343 (2005)) FIG. 12 is a diagram schematically showing the emitter (cathode) of an electron gun. If an angle is formed between an electron trajectory emitted normal to (at a given angle relative to) the cathode surface at position ξ and an optical axis on a reference place (a drift region) is indicated by β as shown in FIG. 12, a focal length f is defined by the following differential equation (3).

$$1/f = -(\partial \sin \beta / \delta \xi)|_{v=0, \xi \to 0} \quad (3)$$

It is seen in the equation (3) that the reciprocal of the electron gun focal length is the limiting ratio of the sine of the emerging ray angle to the off-axis distance of the starting position for the electrons emitted perpendicularly to the cathode surface. A crossover diameter, the minimum beam diameter of an electron beam formed along the optical axis (an electron source diameter) and an angular current density are obtained from the focal length f defined by the equation (3).

If an electron source diameter is indicated by $d_{co}$, a Boltzmann's constant k, an absolute temperature T, the electronic charge e, a potential (an extraction potential) at an extractor electrode $V_{ext}$ and a current density at a cathode (a cathode current density) $j_s$, then an electron source diameter $d_{co}$ and an angular current density $J_\Omega$ are given by the following equations (4) and (5), respectively.

$$d_{co} = 2 \times f \times \{(k \times T)/(e \times V_{ext})\}^{1/2} \quad (4)$$

$$J_\Omega = f^2 \times j_s \quad (5)$$

If a focal length f is longer, an electron source diameter $d_{co}$ is larger as is understood from the equation (4) and an angular current density $J_\Omega$ is also raised as is understood from the equation (5). Hence, in order to set an angular current density $J_\Omega$ in a Schottky emitter with reasonable freedom, it is only required to adjust a focal length f.

Note that the increase (or decrease) of the angular current density $J_\Omega$ by the change in the electron gun focal length necessarily accompanies the increase (or decrease) of the electron source diameter $d_{co}$. Consequently the brightness B itself is independent of the focal length as is shown below, $$B = J_\Omega/\pi(d_{co}/2)^2 = (1/\pi)(e j_s/kT)V_{ext}, \quad (6)$$

Hence, in order to control both of the electron optically important parameters, i.e. the brightness B and the angular current density $J_\Omega$, it is necessary to have simultaneously under control the electron gun focal length f and the cathode current density $j_s$.

Let's start with the electron gun focal length. Then, attention will be paid to the equation (3), which defines a focal length f. It was found in this invention that the electron gun focal length can be adjusted by altering the shape of the Schottky emitter. By scaling up or down the emitter tip radius R it is possible to increase or decrease the off-axis distance ξ which corresponds to a fixed emerging ray angle β. A focal length f defined by the equation (3) is obtained by fitting v (=sin β) in FIG. 12 using the following equation (6).

$$v = (-1/f) \times \xi + \epsilon \times \xi^3 \quad (7)$$

FIG. 13 is a graph showing relationships between ξ and v in cases where two Schottky emitters with different radii of curvature R were employed. The abscissa is assigned to ξ and, also, the ordinate is used for plotting v. To be concrete, employed here is a Schottky emitter formed with a radius of curvature R of a conventional dimension of 0.6 μm and a Schottky emitter formed with a radius of curvature of 2.0 μm, which is larger than conventional size cathodes. As shown in FIG. 13, a curve of a conventionally standard Schottky emitter (R=0.6 μm) is marked with the term "standard SE", while a curve of a Schottky emitter (R=2.0 μm) having a radius of curvature R larger than the conventional size is marked with the term "Giant SE".

In FIG. 13, inclinations of both curves in the vicinity of ξ=0 take a value (−1/f). By comparison in inclination, the Giant SE with a smaller inclination has a focal length f longer than the standard SE with a larger inclination.

As described above, findings and knowledge have been obtained that by adjusting the radius of curvature of the conical end of an emitter one can control a focal length and consequently a angular current density can be freely set. In particular, findings and knowledge have been obtained that if a radius of curvature of the conical end of an emitter is adjusted to be larger than those employed for conventional Schottky emitters, the focal length becomes longer and consequently the angular current density can be increased.

Next, we shall investigate the cathode current density. With Schottky emitters and cold field emitters the current density $j_s$ is a function of the electric field strength at the cathode. Since in the case of the point cathode tip the electric field is enhanced by its small curvature radius, the change in the radius usually influences the field strength. Larger emitters would have a lower field if the other electrode configurations and the applied voltage were unchanged. Because the applied voltages cannot be augmented indefinitely without risk of the discharge, some compensation in the electrodes configuration is necessary in order to recover a high enough electric field with larger radius emitters. One effective way of its realization is to make the protrusion length of the emitter from the suppressor longer in the Schottky emitter module configuration which consists of an emitter, a suppressor and an extractor. By setting an appropriate protrusion length in accordance with the emitter tip radius it is possible to secure high enough tip field under reasonable applied voltage condition.

Therefore, the invention reported here based on the findings and knowledge obtained by the inventors has the following configuration.

That is, an electron beam control method related to the invention is an electron beam control method of generating an electron beam from an electron emitter by Schottky effect by applying an electric field to said emitter, wherein said electron emitter comprises a sharp tip of conical shape and the method comprises the step of adjusting a radius of curvature of said tip, thereby to control the focal length of an electron beam emitted from said tip and thereby control the angular current density of said beam.

A preferable example of the electron beam control method related to the invention is to select a radius of curvature in the range of 1 µm or more. By selecting a radius of curvature in the range of 1 µm or more, a focal length is controlled so as to be longer than in a conventional case where a radius of curvature is in the range from 0.5 µm to no more than 0.6 µm and, besides, a angular current density can be controlled to a higher value than in the conventional case.

Preferably, the electron beam control method related to the invention comprises:

a protrusion length adjusting step of adjusting a protrusion length that is a length of the conical end from a suppressor electrode which is located on the side opposite to the emission direction among the two electrodes applying an electric field and to which a negative voltage is applied; and a combined range setting step of setting a combined range of the protrusion length and the radius of curvature based on the value of the electric field, wherein in the protrusion length adjusting step, a protrusion length is selected in the combined range at a radius of curvature adjusted in the curvature radius adjusting step.

According to the electron beam control method of selecting a protrusion length, a protrusion length is adjusted to thereby enable an electric field strength at the conical end to be controlled. Hence, in a Schottky emitter, a protrusion length is adjusted so as to enable a necessary electric field to be secured. A characteristic of an electric field with the protrusion length also changes according to an emitter's radius of curvature. Therefore, a combined range of a protrusion length and a radius of curvature are set in the combined range setting step based on a value of an electric field. A protrusion length is selected at a radius of curvature adjusted in the curvature radius step within the combined range. The selection enables a protrusion length to be adapted for a radius of curvature.

A preferable example of the electron beam control method selecting a protrusion length is that the radius of curvature is selected in the range of 1 µm or more and 4 µm or less in the curvature radius adjusting step, and a protrusion length is selected in the range of 200 µm or more and 1500 µm or less from the combined range at the radius of curvature adjusted in the curvature radius adjusting step (see FIG. 4), thereby enabling a controlled increase of the angular current density to higher than conventional values to be realized while maintaining the high beam brightness of the Schottky emitter by ensuring the high cathode current density $j_s$ with the appropriate electric field at the tip.

Preferably, the electron beam control method related to the invention comprises: an emitter forming step of adjusting the protrusion length of the conical end and, also, forming the emitter to avoid revealing a (100) crystal plane on the lateral surface of the emitter on the emission side outward from the suppressor electrode that is applied with a negative voltage and located on the side opposite the emission side among the two electrodes applying the electric field.

According to the electron beam control method applying forming not to reveal a (100) crystal plane in the side surface portion of an emitter on the emission side outward from the suppressor electrode, an unnecessary (100) plane is hidden in the rear part on the side opposite the emission side of the suppressor electrode, which enables an unnecessary extraction current to be suppressed. The term "emitter side surface" means a surface parallel to an emission direction of the electron beam.

An electron beam generating apparatus related to the invention is an electron beam generating apparatus comprising: an emitter having the conical end sharpened in the shape of a cone on the emission side of an electron beam; and two electrodes applying an electric field to the conical end of the emitter, wherein the electric field is applied to the conical end to thereby emit electrons using a Schottky effect, so that an electron beam is generated, the electron beam generating apparatus having an improvement that a radius of curvature of the conical end is 1 µm or more.

the electron beam generating apparatus having an improvement that the axial distance of the emitter tip from the suppressor electrode (the protrusion length) is selected from the combined range of the radius of curvature and the axial distance of the emitter tip from the suppressor electrode, where range of values affords a desired electric field in which said emitter is located.

According to the electron beam generating apparatus related to the invention, since a radius of curvature of the conical end is 1 µm or more, a focal length can be longer as compared with a conventional case where a radius of curvature is in the range of 0.5 µm and not more than 0.6 µm and, furthermore, the obtained angular current density can be higher than values obtained under conventional set-ups. In addition, since the emitter tip field is kept high enough by selecting an appropriate protrusion length in accordance with the tip radius, the cathode current density and the beam brightness can be maintained.

An electron beam device comprising the electron beam generating apparatus related to the invention is a device using electron beam generating apparatus including: an emitter having the conical geometry end sharpened in the shape of a cone on the emission side of an electron beam; and two electrodes applying an electric field to the conical end of the emitter, wherein the electric field is applied to the conical end to thereby emit electrons using a Schottky effect, so that an electron beam is generated, the electron beam generating apparatus having an improvement that a radius of curvature of the conical end is 1 µm or more,
the device further comprising:
processing means conducting a predetermined processing based on an electron beam generated by the electron beam generating apparatus.

According to the device using electron beam generating apparatus related to the invention, since a radius of curvature of the conical end is 1 µm or more, a focal length can be longer than a conventional case where a radius of curvature is in the range of 0.5 µm and not more than 0.6 µm and an angular current density can be higher than conventional. In addition, since an angular current density is higher than conventional, the brightness hardly decreases with beam current, so that the processing means can conduct a predetermined processing using an electron beam with a high brightness, thereby enabling the processing means to be applied to various devices.

An example of devices using electron beam generating apparatus related to the invention is an electron probe microanalyzer conducting an analysis or observation of a specimen, and the processing means conducts an analysis or observation of a specimen by irradiating the specimen with an electron beam to obtain an X-ray image based on X-rays generated from the specimen, or by irradiating a specimen with an electron beam to obtain an electron beam image based on secondary electrons or reflected electrons generated from the specimen.

An electron probe microanalyzer is optimal for analyzing or observing a small region of a specimen.

Another example of the device using electron beam generating apparatus related to the invention is an X-ray tube, and the processing means is a target generating X-rays by collision with an electron beam.

Since the X-ray tube is equipped with an emitter emitting an electron beam with a high brightness, an angle of an electron beam when a target is irradiated therewith can be suppressed to be small, thereby enabling an X-ray generating area on the target to be small. Therefore, a spatial resolution of an X-ray image can be improved.

Still another example of the device using electron beam generating apparatus related to the invention is an electron beam lithography system, and the processing means conducts lithography using an electron beam.

Since an electron beam lithography system is equipped with an emitter emitting an electron beam with a high brightness, an angle of an electron beam converging at one point on a pattern used in lithography can be suppressed to be small, thereby, enabling a spatial resolution of a pattern for lithography formed on a target of lithography to be better.

An example of the electron beam generating apparatus or the device using electron beam generating apparatus of the invention is as follows: a suppressor electrode and the emitter are disposed so that a protrusion length, that is a length to the topmost point of the conical end from the suppressor electrode, is in the range of 200 µm or more and 1500 µm or less, and a radius of curvature of the conical end is in the range of 1 µm or more and 4 µm or less. Since a radius of curvature is in the range of 1 µm or more and 4 µm or less and a protrusion length is in the range of 200 µm or more and 1500 µm or less, an angular current density can be higher than in a conventional practice and, at the same time, an electric field at the conical end can be controlled.

In a electron beam generating apparatus or a device using electron beam generating apparatus, the emitter preferably has a form not to reveal a (100) crystal plane in the emitter side surface portion on the emission side outward from a suppressor electrode that is located on the side opposite the emission side among the two electrodes applying an electric field, and applied with a negative voltage.

In this case, since unnecessary (100) planes are hidden in the rear part on the side opposite the emission side of the suppressor electrode, an unnecessary extraction current is suppressed.

An emitter related to the invention is an emitter generating an electron beam in which the conical end of an emitter on the emission side of an electron beam is sharpened in the shape of a cone and is applied with an electric field to thereby emit electrons using a Schottky effect, the emitter having an improvement that
a radius of curvature of the conical end is 1 µm or more.

According to an emitter related to the invention, since a radius of curvature of the conical end is 1 µm or more, a focal length can be longer than a conventional practice where a radius of curvature is in the range of from 0.5 µm to not more than 0.6 µm and an angular current density can be higher than conventional.

In a case where a protrusion length of an emitter is adjusted in the range of 200 µm or more and 1500 µm or less with a radius of curvature in the range of 1 µm or more and 4 µm or less according to the proposed combined range of radius curvature and the protrusion length which ensures high enough tip electric field (see FIG. 4), the beam brightness can be kept high.

An emitter related to the invention preferably has a form not to reveal a (100) crystal plane in the emitter side surface portion.

In this case, unnecessary (100) crystal planes are hidden in the rear part on the side opposite the emission side of the suppressor electrode, which enables an unnecessary extraction current to be suppressed.

BRIEF DESCRIPTION OF THE DRAWINGS

For the purpose of illustrating the invention, there are shown in the drawings several forms of which are presently preferred, it being understood, however, that the invention is not limited to the precise arrangement and instrumentation shown.

FIG. 2 is a schematic diagram of an electron beam generating apparatus equipped with the Schottky emitter;

DESCRIPTION OF THE PREFERRED EMBODIMENTS

Detailed description will be given of a preferred embodiment of the invention below based on the accompanying drawings.

Figure 1A:
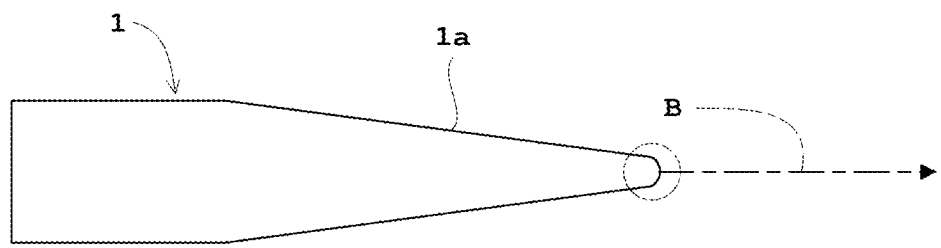
FIG. 1A is a schematic diagram showing a Schottky emitter related to one example of the invention.
Figure 1B:
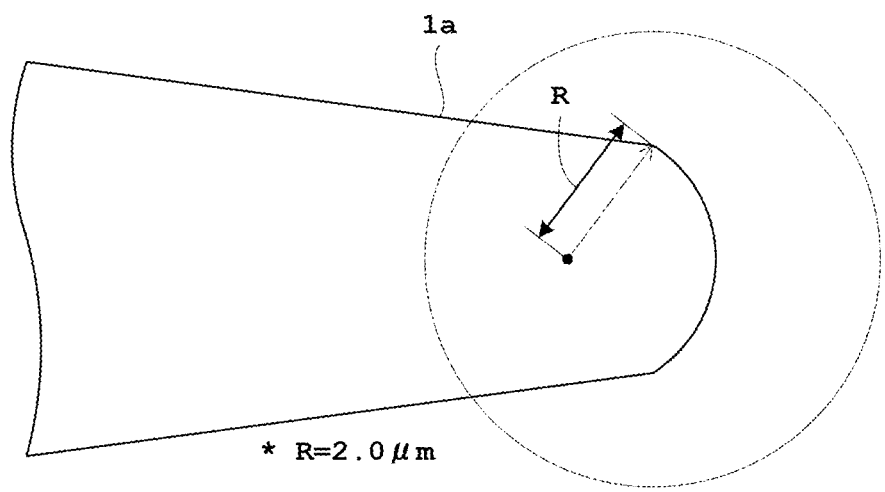
FIG. 1B is an enlarged schematic diagram of the conical end of the emitter.
Figure 1C:
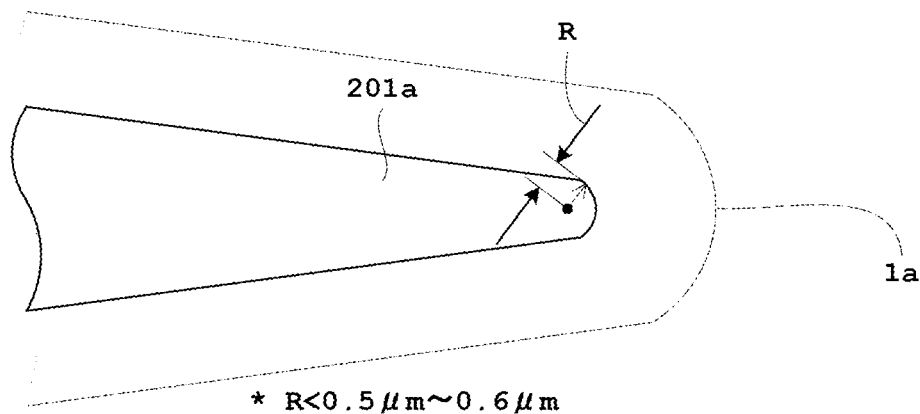
FIG. 1C is an enlarged diagram for comparison with the conical end of a conventional emitter.
Figure 3:
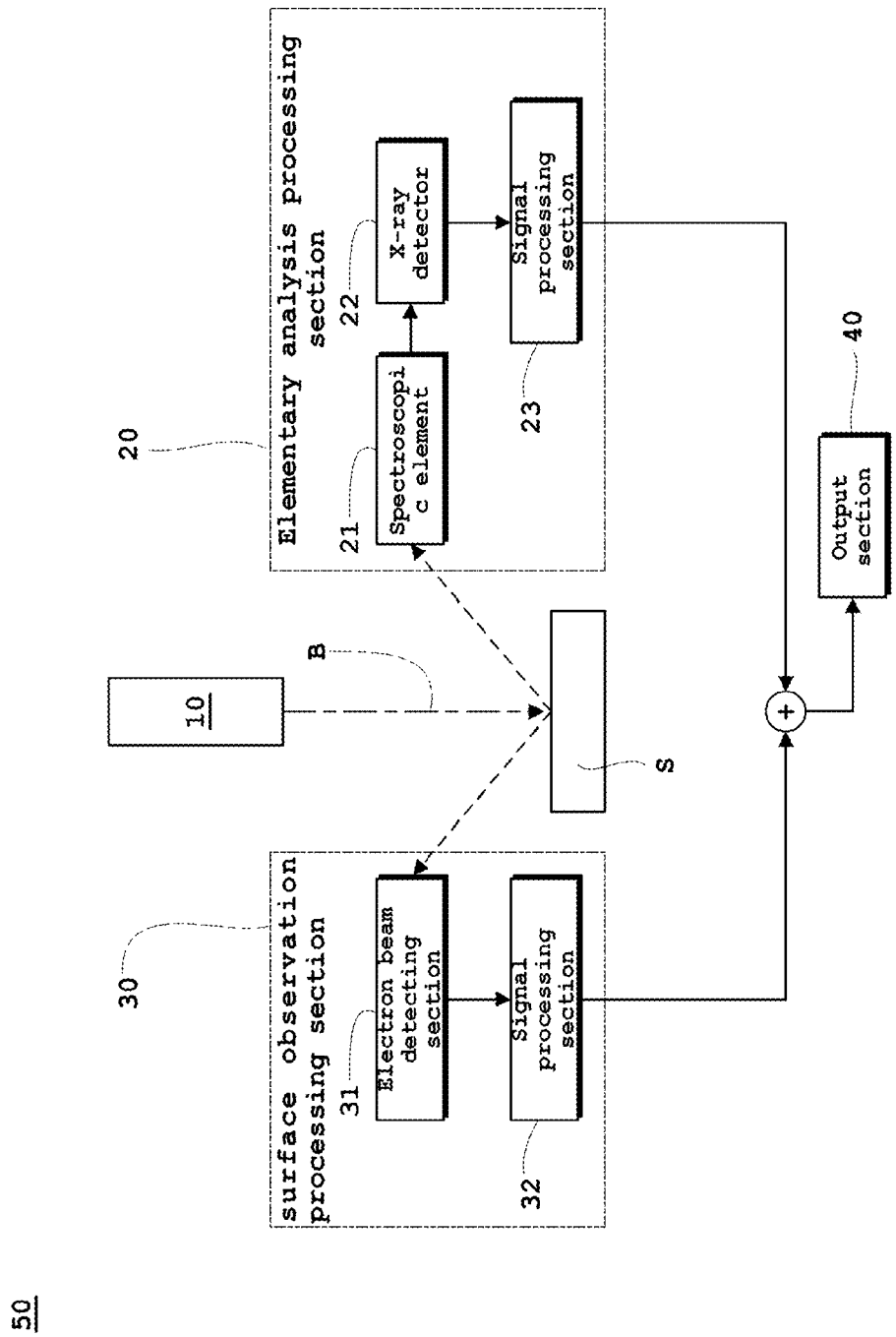
FIG. 3 is a schematic block diagram of an electron probe microanalyzer (EPMA) equipped with the electron beam generating apparatus.

FIG. 1A is a schematic diagram showing a Schottky emitter related to one example of the invention. FIG. 1B is an enlarged schematic diagram of the conical end of the emitter. FIG. 1C is an enlarged diagram for comparison with the conical end of a conventional emitter. FIG. 2 is a schematic diagram of an electron beam generating apparatus equipped with the Schottky emitter. FIG. 3 is a schematic block diagram of an electron probe microanalyzer (EPMA) equipped with the electron beam generating apparatus.

Figure 11A:
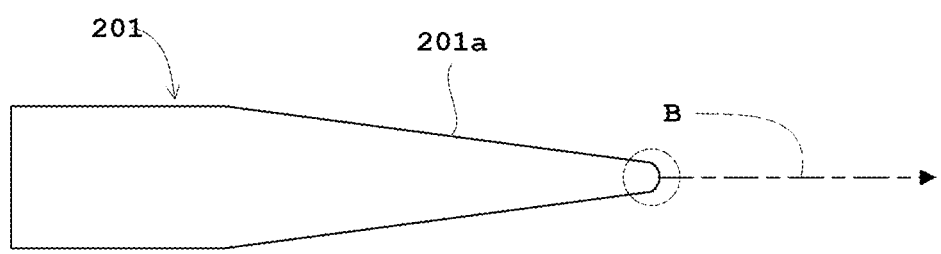
FIG. 11A is a schematic diagram showing a conventional Schottky emitter.
Figure 11B:
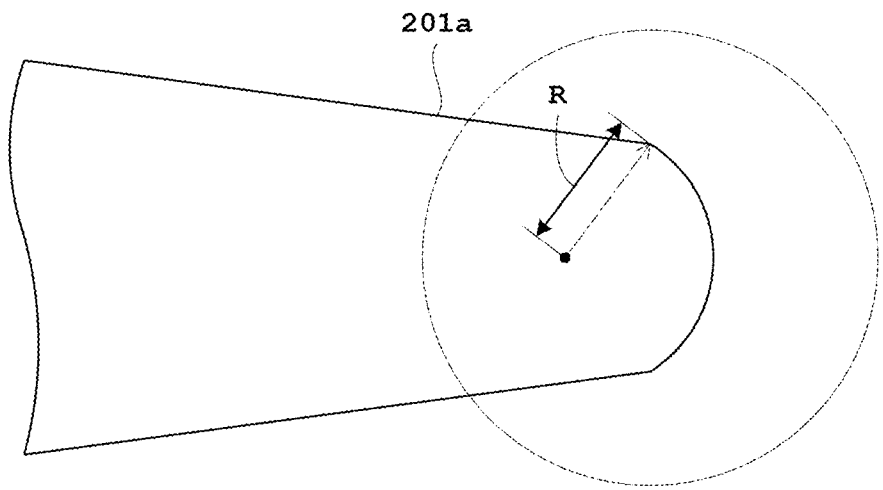
FIG. 11B is an enlarged schematic diagram of the conical end of the emitter.
Figure 12:
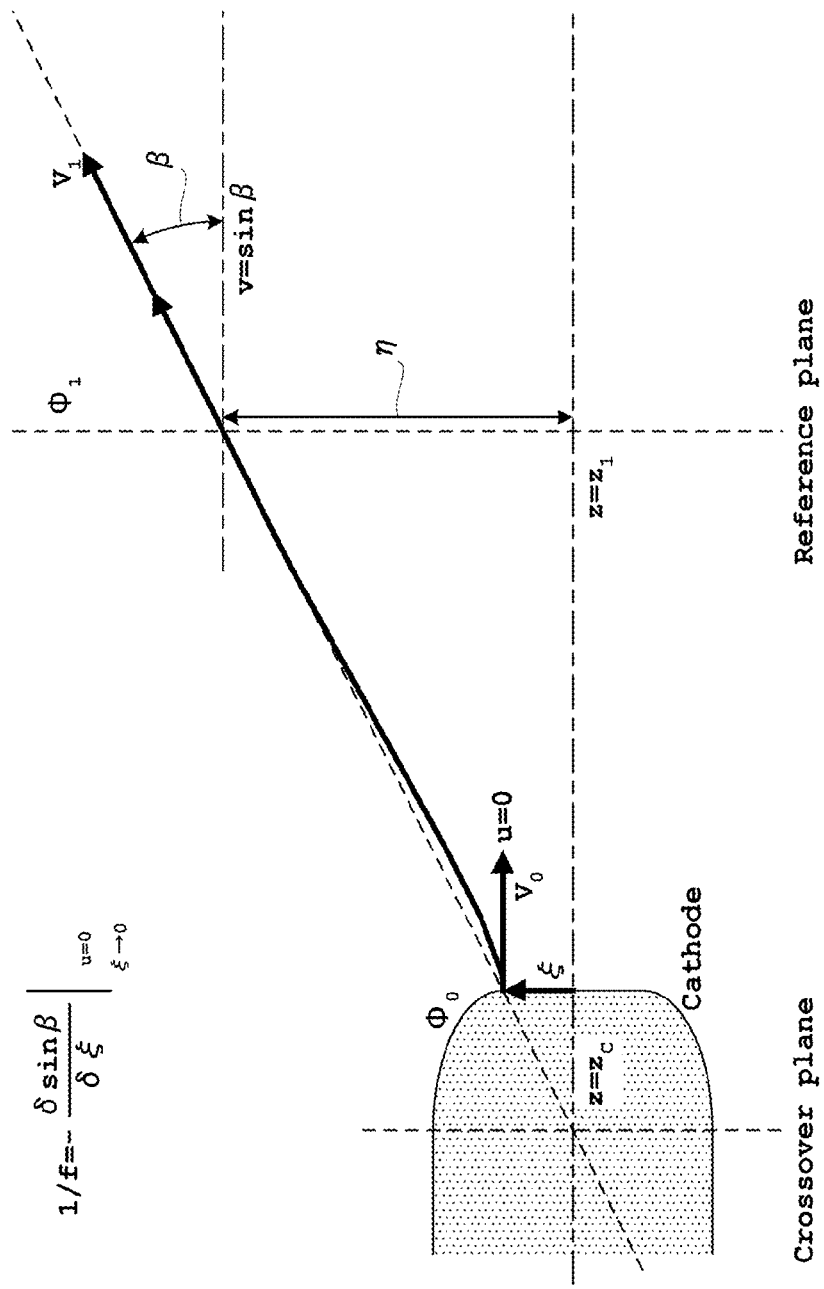
FIG. 12 is a diagram schematically showing an emitter of an electron gun and the definition of the electron gun focal length.
Figure 13:
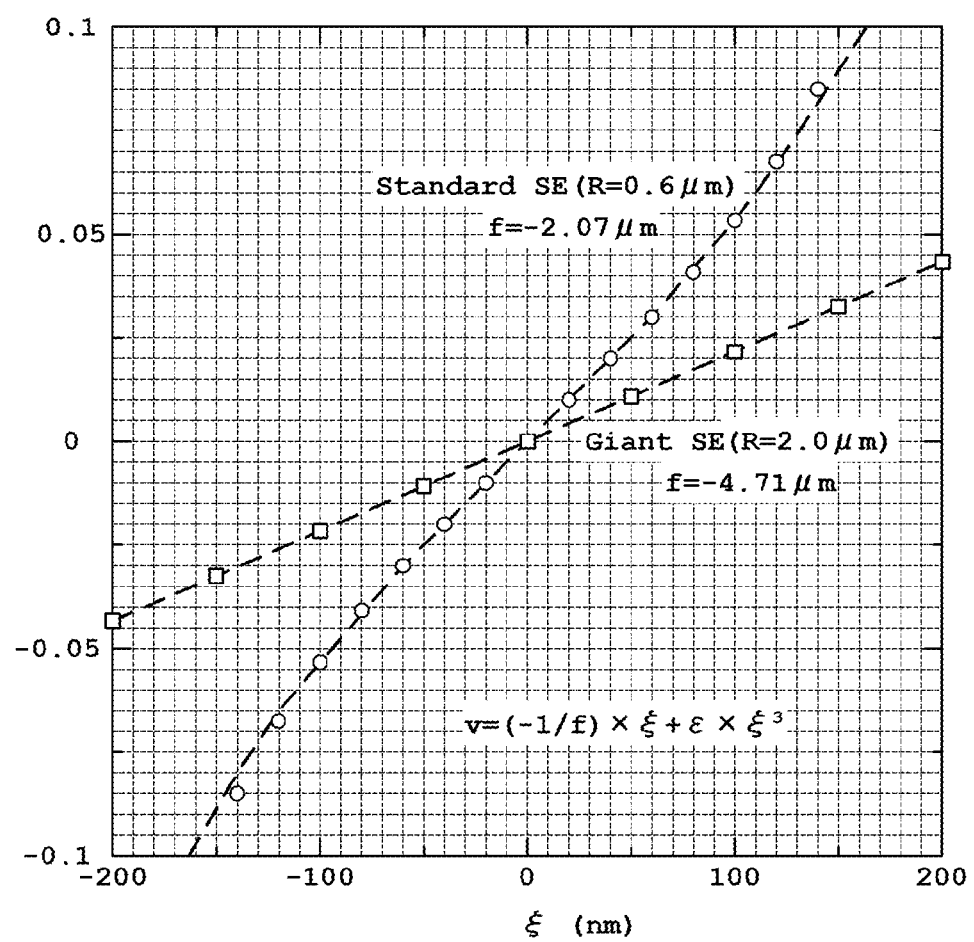
FIG. 13 is a graph describing the findings and knowledge leading to the invention.

A Schottky emitter 1 related to the example, as shown in FIG. 1A, has the conical end 1a sharpened in the shape of a cone on the emission side of an electron beam B (here, the symbol "B" in the figure denotes the electron beam and should not be confused with the quantity representing the brightness). The Schottky emitter 1 has a construction in which a zirconium oxide layer is coated on a single crystal wire of tungsten. As shown in FIG. 1B, a radius of curvature R of the conical end 1a is 2.0 μm and preferably in the range of 1 μm or more, which is larger as compared with a conventional conical end 201a in the range of 0.5 μm and not more than 0.6 μm (see FIG. 11B and FIG. 1C). Note that in FIG. 1C, the conical end 1a of a Schottky emitter 1 related to the example is shown with a two-dot chain line.

An electron beam generating apparatus 10 equipped with the Schottky emitter 1, as shown in FIG. 2, includes two electrodes 2 and 3 applying an electric field to the conical end 1a of the Schottky emitter 1; an anode 4 extracting an electron beam B; and a condenser lens 5 converging the electron beam B. A portion consisting of the Schottky emitter 1 and the electrodes 2 and 3 (a suppressor electrode 2 and an extractor electrode 3 described later) is called an electron source. The electron source is easy to be understood with a potential of the Schottky emitter 1 as a reference (in FIG. 2, the potential is 0 V. In an actual case, a potential of the emitter 1 is usually at a negatively high potential). The conical end 1a is heated under a strong electric field applied thereto by the electrodes 2 and 3 to thereby emit electrons using a Schottky effect and the electron beam B is thus generated by the electron beam generating apparatus 10. The electron beam generating apparatus 10 corresponds to an electron beam generating apparatus of the invention and also corresponds to an electron beam generating apparatus.

Of the two electrodes 2 and 3, the electrode 2 located on the side opposite the emission side and applied with a negative voltage (in FIG. 2, −300 V) is a suppressor electrode 2 and the electrode 3 located on the emission side and applied with a positive voltage (in FIG. 2, 6423 V) is an extractor electrode 3.

The anode 4 is disposed opposite the Schottky emitter 1 serving as a cathode and applied with a positive voltage with respect to the emitter 1. The anode 4 attracts the electron beam B emitted from the Schottky emitter 1. The electron beam B is accelerated by attraction by the anode 4.

The condenser lens 5 is constructed in the shape of a ring. A current is supplied into the condenser lens 5 from a lens power supply not shown to thereby generate a magnetic field to converge the electron beam B in a similar way to light in an optical condenser lens.

Description will be given of a configuration of the Schottky emitter 1, the electrodes 2 and 3, the anode 4 and the condenser lens 5 in the electron beam generating apparatus 10, again, with reference to FIG. 2. The suppressor electrode 2 and the extractor electrode 3 are disposed with a spacing of 700 μm therebetween. Even though the spacing is similar to the conventional Schottky emitter configurations, the disposition of each electrode is unique. The length from the suppressor electrode 2 to the topmost point of the conical end 1a is indicated by $L_{st}$. On the other hand, a length to the extractor electrode 3 from the topmost point of the conical end is indicated by $L_{TE}$. Hence, a relation that $L_{st}+L_{TE}=700$ μm is established. If the emitter is operated with the same protrusion length $L_{ST}$ of 250 μm as conventional, an electric field strength F at the conical end 1a cannot be secured to be a necessary value (in this case, $F=1\times10^9$ V/m). Therefore, a protrusion length $L_{ST}$ is set to be longer than conventional case in order to raise an electric field strength F to a necessary value ($1\times10^9$ V/m). In a case of a Schottky emitter where a radius of curvature R of the conical end 1a is 2.0 μm, the Schottky emitter 1 and the suppressor electrode 2 are disposed so that a protrusion length $L_{ST}$ is 400 μm. Therefore, $L_{TE}$ is 300 μm (=700 μm−$L_{ST}$).

Figure 4:
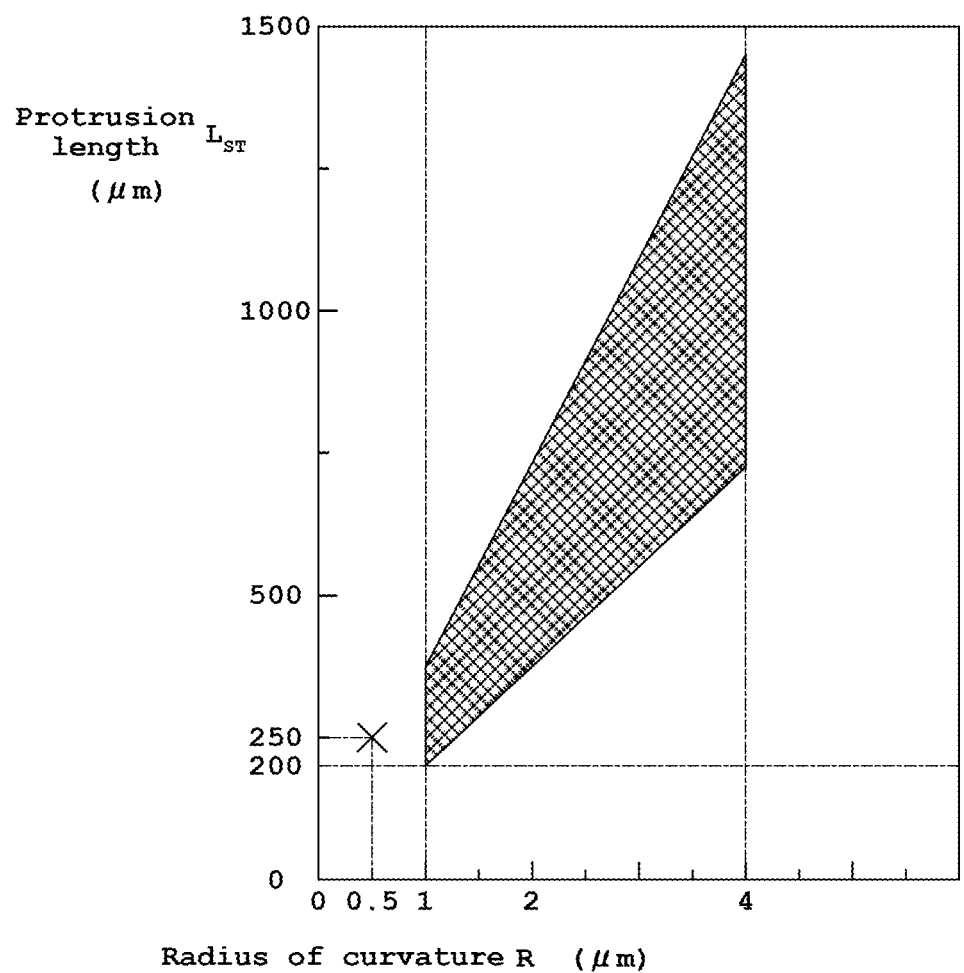
FIG. 4 is a graph roughly showing a combined range of a protrusion length and a radius of curvature.

In order to secure a necessary electric field strength F at the conical end 1a, a protrusion length $L_{ST}$ is adjusted so as to be adapted for a radius of curvature R. That is, a characteristic of an electric field versus a protrusion length $L_{ST}$ also varies depending on a radius of curvature R. Hence, as shown in FIG. 4, a combined range of a protrusion length $L_{ST}$ and a radius of curvature R are set in advance based on a value of an electric field necessary for field emission in the Schottky mode. In this case, a protrusion length $L_{ST}$ and a radius of curvature R are individually altered to estimate the combined range suitable for the necessary electric field strength F ($1\times10^9$ V/m) (see a crosshatched portion in FIG. 4). That is, a combined range of a radius of curvature R and a protrusion length $L_{ST}$ necessary for an operation of the Schottky emitter 1 is defined by the hatched area in FIG. 4. Note that in FIG. 4, there is shown a combination of a radius of curvature R and a protrusion length $L_{ST}$ (where R=0.5 μm and LST=250 μm) of a conventional standard Schottky emitter (with R=0.5 μm) with a mark "x".

A distance between the anode 4 and the condenser lens 5 is indicated by L. In a case of a thermionic emitter, the anode 4 and the condenser lens 5 are spaced with a distance of a value of the order of L=100 mm. Though L is longer and a lens aberration coefficient is larger, the problem of larger aberrations leading to larger beam diameter is not incurred since a thermionic emitter has a large angular current density. Contrast thereto, in a case of a Schottky emitter, since an angular current density is smaller, the intrinsically high brightness of the Schottky emitter is degraded by an increase in lens aberration coefficients. Hence, in a case of a Schottky emitter, it is preferable that in order to suppress a lens aberration coefficient, L is set to be as close to 0 mm as possible to thereby locate the condenser lens 5 so as to be closer to the side of the Schottky emitter 1.

Figure 5A:
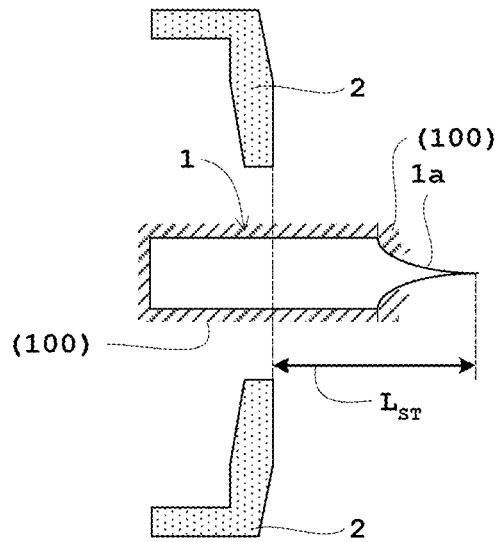
FIG. 5A is a schematic diagram showing a configuration of a suppressor electrode and a Schottky emitter processed by means of a DC etching method or a similar means to produce similar shapes.

If a Schottky emitter 1 is processed using a direct current (DC) etching method or other suitable means, unnecessary (100) crystal planes are revealed, as shown in FIG. 5A, forward from the suppressor electrode 2, that is on the emission side (see hatching with oblique lines inclined to the right in the figure). A work function of a (100) crystal plane decreases by the action of a zirconium oxide layer and an unnecessary extraction current is extracted with a result of increasing a load on a power supply. As a result, larger outgas rate, which is a gas load from the surrounding electrode surfaces, is generated to degrade the degree of vacuum in the vicinity of the emitter. The term, a DC etching method, is an etching conducted without altering polarities of electrodes used in the etching.

Figure 5B:
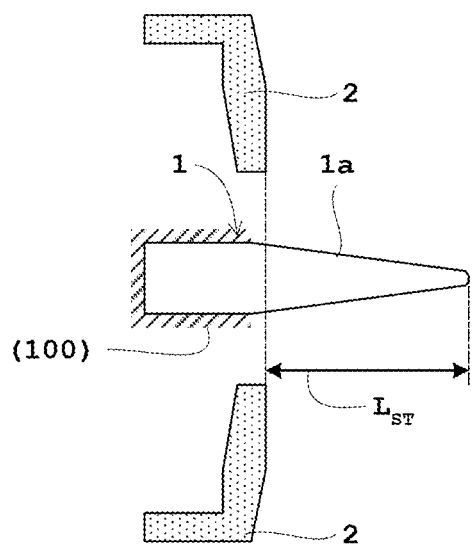
FIG. 5B is a schematic diagram showing a configuration of a suppressor electrode and a Schottky emitter processed by means of an AC etching method or other means to produce similar shapes.

Contrast thereto, in a case where an alternate current (AC), or similar means are used in forming a Schottky emitter 1, the etching can be conducted, as shown in FIG. 5B, so that the conical end 1a in the shape of a cone is longer with oblique lines in profile. The AC etching method enables not only an etched macro face with oblique lines in profile to be obtained, but also a crystal face different from a (100) to be microscopically produced. Hence, by processing the Schottky emitter 1 with an AC etching method, a (100) is not revealed on a crystal surface in the emitter side surface portion on the emission side outward from the suppressor electrode 2. The term "emitter side surface" is a surface parallel to the emission direction of the electron beam B. Therefore, hatching with oblique lines inclined to the right in the figure indicates (100) crystal planes in the emitter side surface portion. With such a construction adopted, unnecessary (100) crystal planes are hidden in the rear part on the side opposite the emission side of the suppressor electrode 2, which enables an unnecessary extraction current to be suppressed. The term, an AC etching method, is to conduct etching while polarities of electrodes used for the etching are alternated.

Then, description will be given of a method for controlling an electron beam. To begin with, a radius of curvature R of the conical end 1a is adjusted. A radius of curvature R is adjusted to a value larger than conventional in order to control the electron gun focal length f to be longer and to control the angular current density to be higher. Since a radius of curvature of a conventional conical end 1a is in the range of 0.5 μm to no more than 0.6 μm, it is preferable to select a radius of curvature R in the range of 1 μm or more. In one embodiment given here by way of example, a radius of curvature R is selected to be 2 μm.

As described above, a combined range of a protrusion length $L_{ST}$ and a radius of curvature R is set in advance based on an electric field value. The suppressor electrode 2 and the Schottky emitter 1 are disposed by determining a protrusion length $L_{ST}$, which is a length from the suppressor electrode 2 to the topmost point of the conical end of the Schottky emitter 1. In adjustment of a protrusion length $L_{ST}$, a protrusion length $L_{ST}$ is selected from the combined range shown in FIG. 4 at an adjusted radius of curvature R.

In FIG. 4, a desirable combined range of a radius of curvature R and the protrusion length $L_{ST}$ is defined in the range selected in the range 1 μm<R<4 μm and 200 μm<$L_{ST}$<1500 μm. In one embodiment shown here by way of example, a combination of a radius of curvature R and a protrusion length $L_{ST}$ (R=2.0 μm and $L_{ST}$=400 μm) is selected. By selecting a combination point in the combined range in FIG. 4, an electric field strength F at the conical end 1a can be controlled (in the example, F=1×10$^9$ V/m).

A focal length f or the electron beam B is controlled by a radius of curvature R thus adjusted. An angular current density of the electron beam B is controlled by a controlled focal length f, while the beam brightness is maintained at its intrinsically high value by guaranteeing a large enough tip electric field through the emitter protrusion length adjustment.

In a case where a radius of curvature of the conical end 1a is set in the range of 1 μm or more and 4 μm or less and a protrusion length $L_{ST}$ of the Schottky emitter 1 is adjusted in the range of 200 μm or more and 1500 μm or less, an angular current density can be higher than conventional and at the same time, an electric field F at the conical end 1a can be controlled to maintain the high beam brightness.

Since an angular current density is higher than conventional geometry, a brightness is scarcely reduced even at relatively high beam currents and in the EPMA 50 of the example, the elementary analysis processing section 20 and the surface observation processing section 30 can conduct predetermined processing such as elementary analysis processing and surface observation processing, respectively with a high brightness electron beam. Therefore, the invention can be applied to various apparatuses represented by such an EPMA 50.

Note that in a case where an electron beam generating apparatus 10 related to the example is used in EPMA 50, the following effect is exerted. That is, EPMA 50 requires a beam current at a level of sub μA or μA, and it is also confirmed in FIG. 6 that in EPMA 50, no reduction in the brightness in the Schottky emitter 1 is observed even with a level of sub μA or μA.

Figure 6:
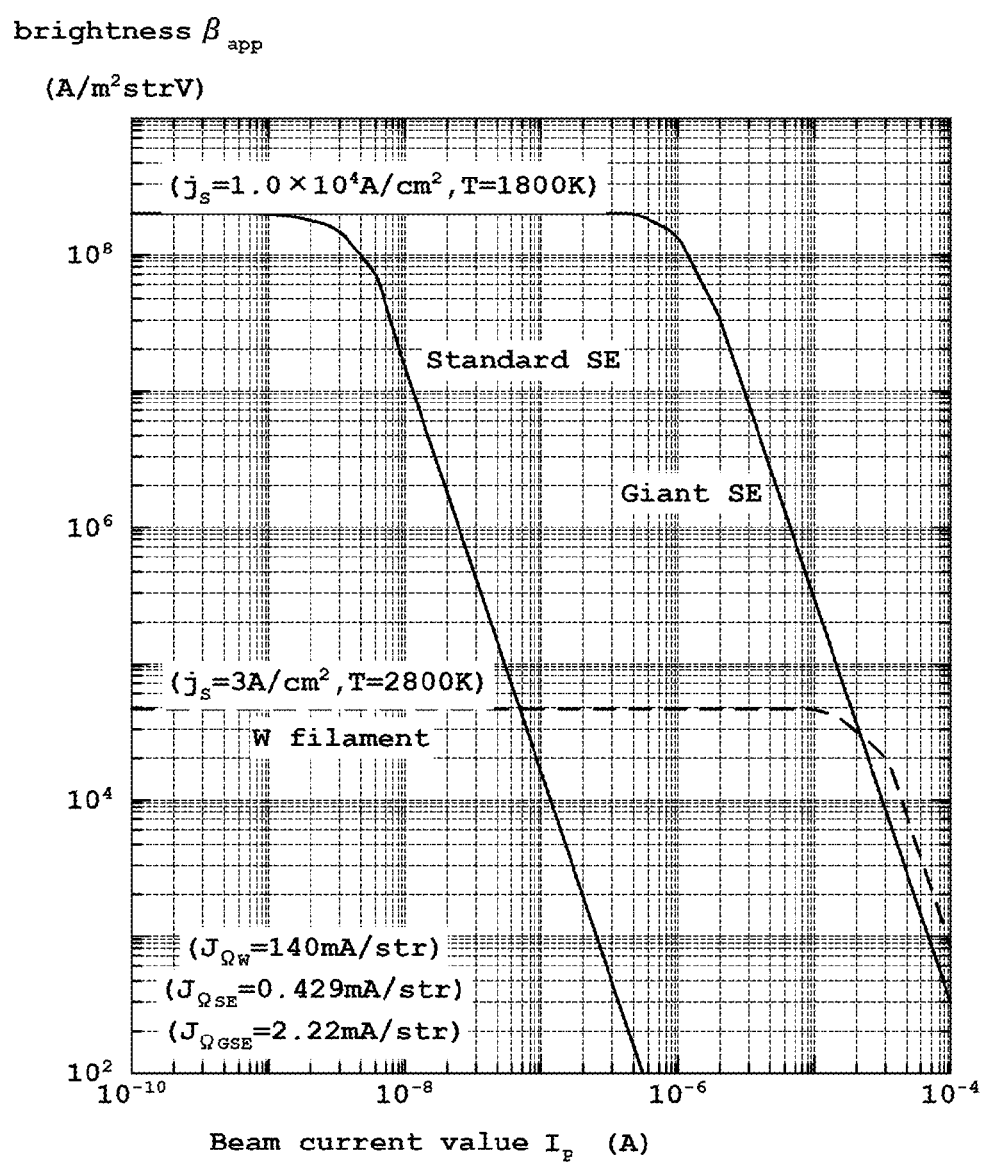
FIG. 6 is a graph showing relationships between a beam current value and a reduced brightness in an example of the invention, a standard Schottky emitter of a conventional technology, and a tungsten filament emitter.
Figure 10:
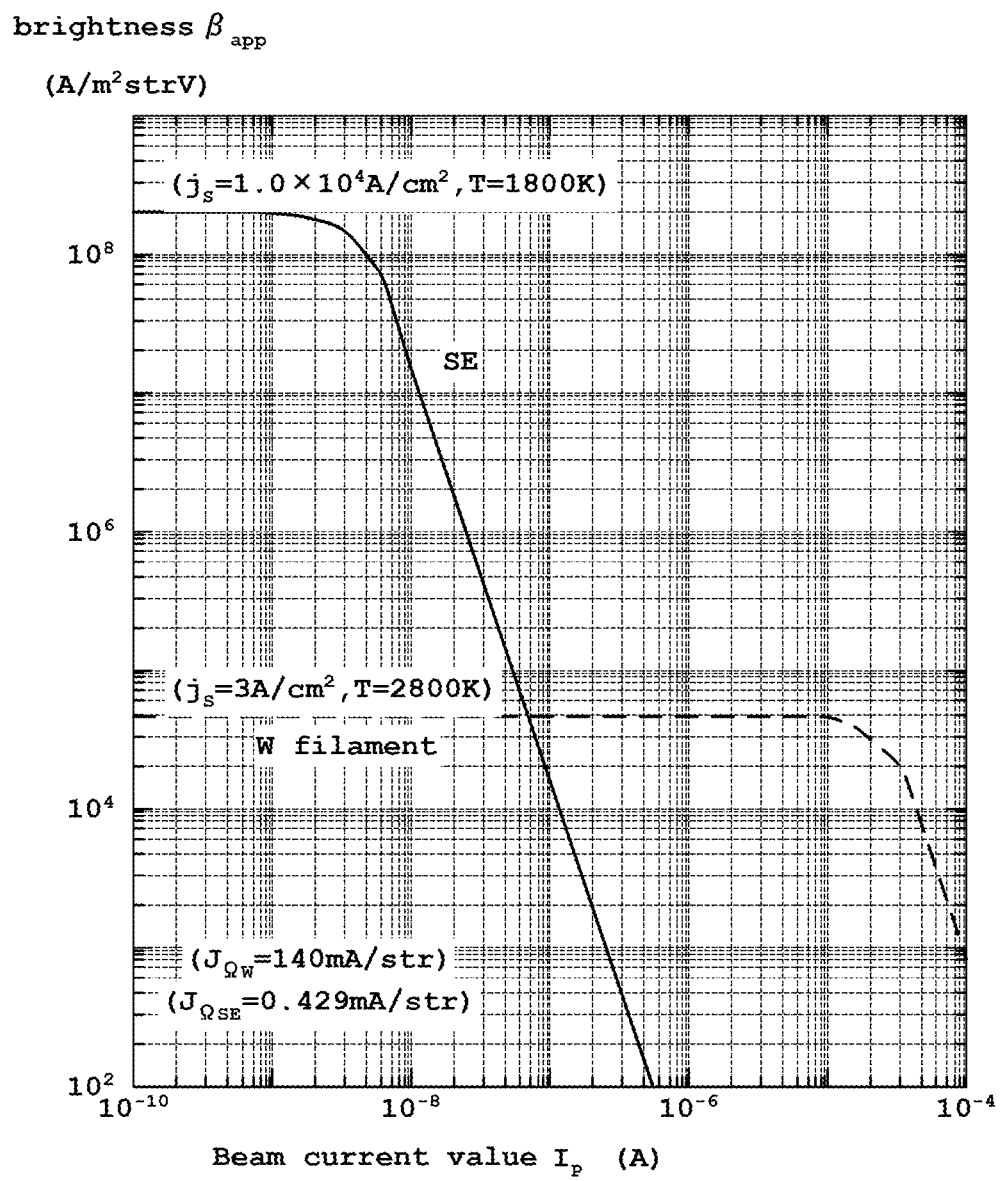
FIG. 10 is a graph showing relationships between a beam current value and brightness in a conventional Schottky emitter and a tungsten filament emitter.

FIG. 6 is a graph showing relationships between a beam current value and a brightness in a Schottky emitter 1 (R=2.0 μm) related to the example, a standard Schottky emitter (R=0.6 μm) of a conventional technology and a tungsten filament emitter as a thermionic emitter. That is, the graph of FIG. 6 is obtained by adding the graph showing a relationship between a beam current value and a brightness in the Schottky emitter 1 related to the example to FIG. 10. FIG. 6 was obtained in the same condition as in FIG. 10. In the Schottky emitter 1 related to the example, however, the relationships were obtained in the conditions that a current density $j_s$ is 1.0×10$^4$ A/cm$^2$, a temperature T is 1800 K and a angular current density $J_{ΩGSE}$ is 2.22 mA/str. A curve drawn with a dotted line is a curve of the tungsten filament emitter and two curves drawn with a solid line in FIG. 6 is a curve of the Schottky emitter, wherein "Giant SE" in the graph indicates the curve of a Schottky emitter 1 (R=2.0 μm) related to the example having a radius of curvature R of the conical end 1a larger than conventional and "Standard SE" indicates the curve of a conventional standard Schottky emitter (R=0.6 μm). The mark of "W filament" in the graph indicates a tungsten filament.

It is found from FIG. 6 that in the case of a conventional standard Schottky emitter, an angular current density is low and an electron source diameter is small; therefore, a brightness begins to decrease at a beam current in the vicinity of 1 nA or greater and reduces by as much as 6 orders of magnitude at a level of 1 μA. Contrast thereto, in a case of a Schottky emitter 1 related to the example, an angular current density is high; therefore, it has been confirmed that a brightness is hard to decrease as compared to a standard Schottky emitter and a brightness decrease starts at about 1 μA if a position of the condenser lens 5 is properly selected. Hence, a Schottky emitter can be applied to a device requiring a beam current at a level of sub μA or μA such as in an EPMA 50.

The invention can be modified in the following way without limiting to the embodiment.

(1) In the example, description was given of an electron probe microanalyzer (EPMA) as an example of a device using an electron beam generating apparatus, no specific limitation is imposed on a device as far as an electron beam generating apparatus is used therein. For example, the device may be a scanning electron microscope (SEM), a transmission electron microscope (hereinafter also referred to as "TEM" for short), a microfocus X-ray tube, an Auger electron spectrometer, an electron beam lithography system and an electron beam writer. A transmission electron microscope (TEM) can observe a projected image by causing an electron beam to be transmitted through a thin film specimen with a thickness of the order in the range of several tens to hundreds of nanometers. A microfocus X-ray tube generates an X-ray beam with a small diameter of the order in the range of from sub μm to several μm by causing an electron beam to collide with a target. An Auger electron spectrometer examines energy of Auger electrons to conduct an elementary analysis on a specimen. An electron beam lithography system conducts lithography with an electron beam instead of light in a conventional technology. An electron beam writer produces "masters" for high density optical disks.

Figure 7:
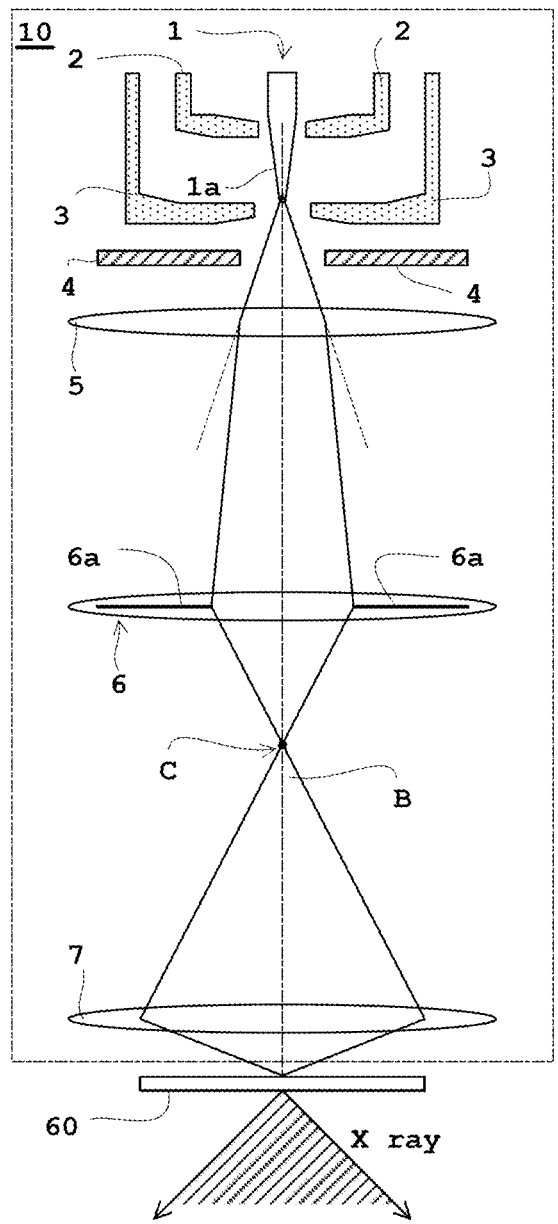
FIG. 7 is a schematic block diagram of a microfocus X-ray tube equipped with a Schottky emitter.

Description will be given not only of the microfocus X-ray tube but also of the electron beam exposure system as an example of electron beam lithography system. FIG. 7 is a schematic block diagram of a microfocus X-ray tube and FIG. 8 is a schematic block diagram of an electron beam exposure system.

A microfocus X-ray tube 70 equipped with an electron beam generating apparatus 10, as shown in FIG. 7, includes a target 60 generating X-rays by collision of an electron beam therewith. The electron beam generating apparatus 10 is equipped with not only the suppressor electrode 2, the extractor electrode 3, the anode 4 and the condenser lens 5, but also an iris lens 6 and an objective lens 7. The iris lens 6 has an aperture 6a having a diameter reducing hole that defines converging angle of an electron beam B. The condenser lens 5, the iris lens 6, the objective lens 7 and the target 60 are sequentially disposed in order from the upstream side (the emitter 1 side) to the downstream side in an irradiation direction of the electron beam B. The target 60 is formed from a material generating X-rays represented by tungsten. The target 60 corresponds to processing means of the invention.

Since the microfocus X-ray tube 70 has a Schottky emitter 1 in which an electron beam brightness does not deteriorate at a high beam current condition, an angle of the electron beam B when the target 70 is irradiated with the electron beam B can be suppressed to be small, thereby enabling the electron beam size focused on the target to be small. Consequently, an X-ray generating region on the target 60 can be smaller, and a spatial resolution of an X-ray image is improved.

Figure 8:
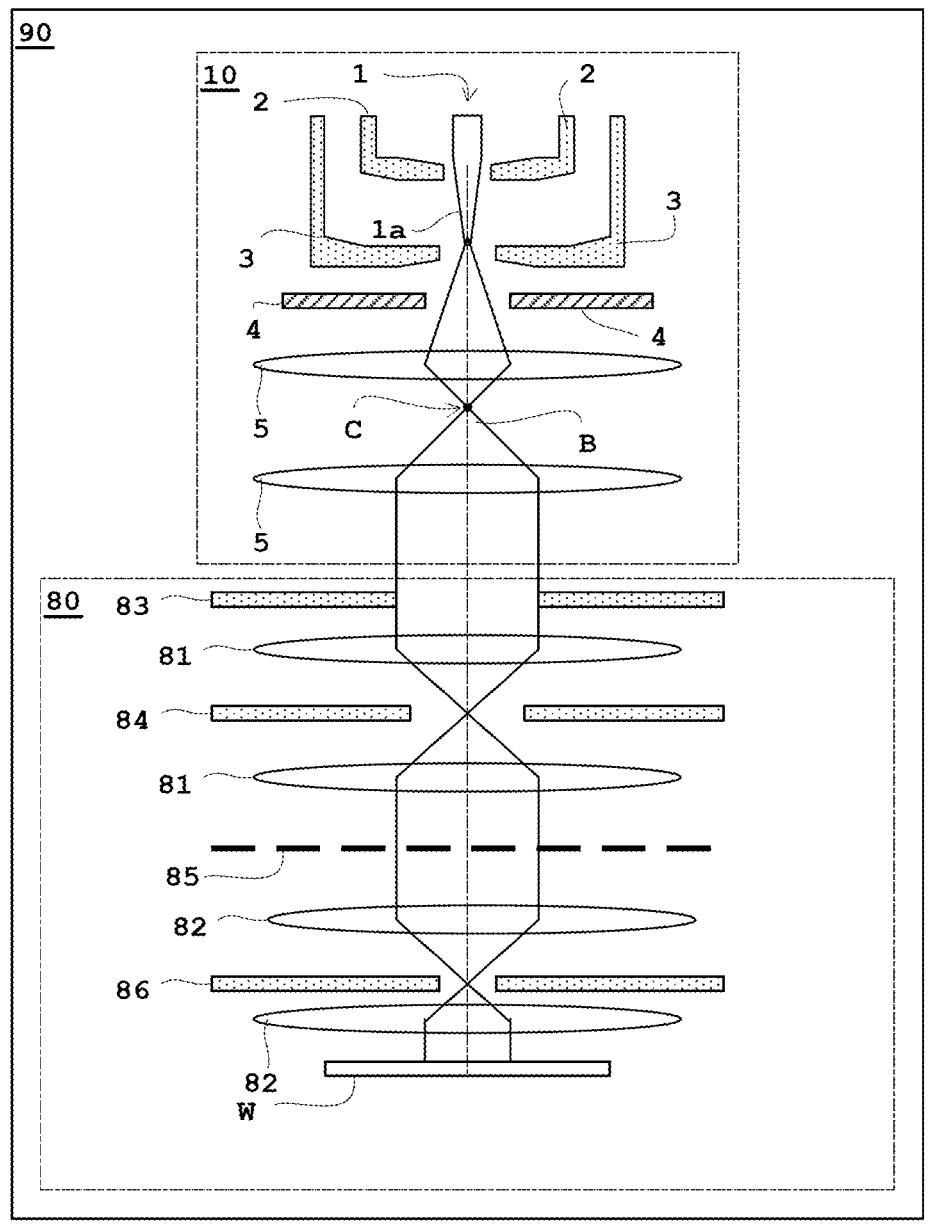
FIG. 8 is a schematic block diagram of an electron beam exposure system equipped with a Schottky emitter.
Figure 9A:
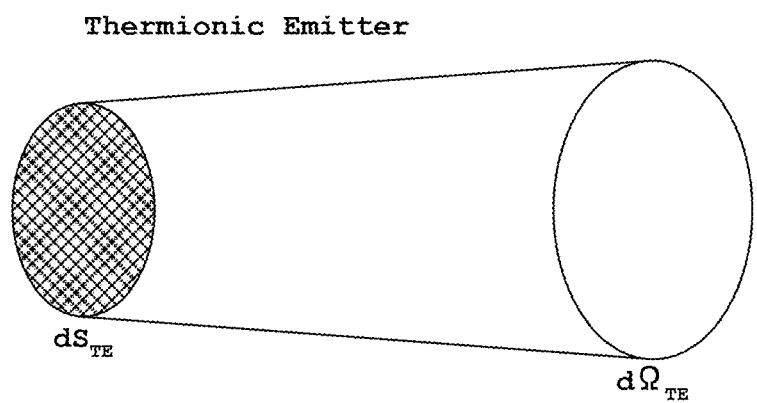
FIG. 9A is a diagram schematically showing an electron source characteristics when an electron beam is emitted from an electron gun of a thermionic emitter.
Figure 9B:
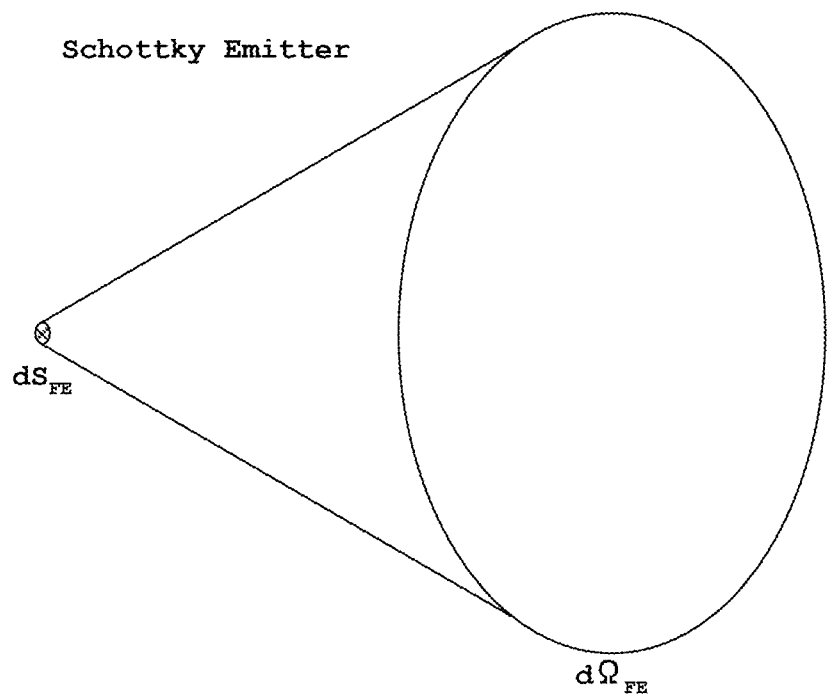
FIG. 9B is a diagram schematically showing an electron source characteristics when an electron beam is emitted from an electron gun of a field emitter.

The electron beam exposure system 90 equipped with the electron beam generating apparatus 10 includes an exposure processing section 80 conducting exposure on a substrate W as shown in FIG. 8. The electron beam generating apparatus 10 is equipped with: the suppressor electrode 2; the extractor electrode 3; the anode 4; and the condenser lens 5. The exposure processing section 80 is equipped with: irradiation lens 81, image forming lens 82; a shaping aperture 83; a blanker 84; a reticle 85; and a contrast aperture 86. The reticle 85 is an original drawing of an exposure pattern. The exposure processing section 80 corresponds to processing means of the invention.

In the electron beam exposure system 80 shown in FIG. 8, each pair of lenses 5, 81 and 82 is disposed one on the other. Not only is the shaping aperture 83 disposed between the condenser lens 5 on the downstream side and the irradiation lens 81 in the upstream side in the irradiation direction of the electron beam B, but the blanker 84 is disposed between the irradiation lens 81 on the upstream side and the irradiation lens 81 on the downstream side in the irradiation direction of the electron beam B. Not only is the reticle 85 disposed between the irradiation lens 81 on the downstream side 81 and the image forming lens 82 on the upstream side, but the contrast aperture 86 is disposed between the image forming lens 82 on the upstream side and the image forming lens 82 on the downstream side.

Since the electron beam exposure system 90 is equipped with a Schottky emitter 1 emitting an electron beam B high in brightness, an angle of the electron beam B converging to one point on the reticle 85 can be suppressed to be small, thereby enabling a spatial resolution of an exposure pattern focused on the substrate W to be improved.

(2) In the example, an AC etching method is adopted to form the Schottky emitter 1 so as not to reveal a (100) crystal plane in the emitter side surface portion on the emission side outward from the suppressor electrode 2, while no limitation is placed on an AC etching method as far as a (100) crystal plane is not revealed in the emitter side surface portion.

(3) In the example, a Schottky emitter 1 has a shape where no (100) crystal plane is revealed in the emitter side surface portion on the emission side outward from the suppressor electrode 2, while the Schottky emitter 1 is not necessarily required to have a shape shown in FIG. 5B unless an unnecessary extraction current is suppressed. For example, as shown in FIG. 5A, unnecessary (100) crystal planes may be revealed forward from the suppressor electrode 2.

The invention may be embodied in other specific forms without departing from the spirit or essential attributes thereof and, accordingly, reference should be made to the appended claims, rather than to the foregoing specification, as indicating the scope of the invention.

In this specification, the verb "comprise" has its normal dictionary meaning, to denote non-exclusive inclusion. That is, use of the word "comprise" (or any of its derivatives) to include one feature or more, does not exclude the possibility of also including further features.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

What is claimed is:

1. An electron beam control method comprising an electron beam generating step of emitting electrons from the conical end of an emitter sharpened in the shape of a cone on the emission side of an electron beam by using a Schottky effect under an electric field applied to the conical end to thereby generate an electron beam, the method further comprising:
    a curvature radius adjusting step of adjusting a radius of curvature of the conical end;
    an electron gun focal length control step of controlling an electron gun focal length of an electron beam by a radius of curvature adjusted in the curvature radius adjusting step; and
    an angular current density control step of controlling an angular current density of an electron beam with a focal length controlled by the electron gun focal length control step,
    wherein the electron beam generating step is conducted each time emission of an electron beam in a state where an angular current density is controlled after the angular current density control step.

2. The electron beam control method according to claim 1, wherein the radius of curvature is selected in the range of 1 μm or more in the curvature radius adjusting step.

3. The electron beam control method according to claim 1, further comprising:
    a protrusion length adjusting step of adjusting a protrusion length that is a length of the conical end from a suppressor electrode which is on the side opposite the emission side among the two electrodes establishing an electric field and to which a negative voltage is applied when the conical end is protruded on the emission side outward from the suppressor electrode; and
    a combination range setting step of setting a combination range of the protrusion length and the radius of curvature based on the value of the electric field,
    wherein in the protrusion length adjusting step, a protrusion length is selected in the combination range at a radius of curvature adjusted in the curvature radius adjusting step based on the combination range.

4. The electron beam control method according to claim 3, wherein the radius of curvature is selected in the range of 1 μm or more and 4 μm or less in the curvature radius adjusting step, and a protrusion length is selected in the range of 200 μm or more and 1500 μm or less from the combination range at the radius of curvature adjusted in the curvature radius adjusting step based on the combination range and the radius of curvature.

5. The electron beam control method according to claim 1, further comprising:
    an emitter forming step of adjusting the protrusion length of the conical end and, also, applying the emitter with forming not revealing a {100} crystal plane in the side surface portion of the emitter on the emission side outward from the suppressor electrode that is applied with a negative voltage and located on the side opposite the emission side among the two electrodes applying the electric field.

6. An electron beam generating apparatus comprising:
    an emitter having the conical end sharpened in the shape of a cone on the emission side of an electron beam; and
    two electrodes applying an electric filed to the conical end of the emitter,
    wherein the electric field is applied to the conical end to thereby emit electrons using a Schottky effect, so that an electron beam is generated, the electron beam generating apparatus having an improvement that a radius of curvature of the conical end is 1 μm or more to control an electron gun focal length.

7. The electron beam generating apparatus according to claim 6, wherein a suppressor electrode and the emitter are disposed so that a protrusion length, that is a length to the topmost point of the conical end from the suppressor electrode, is in the range of 200 μm or more and 1500 μm or less when the conical end is protruded on the emission side outward from the suppressor electrode, wherein the suppressor electrode is on the side opposite the emission side among the two electrodes establishing an electric field and carry a negative voltage, and a radius of curvature of the conical end is in the range of 1 μm or more and 4 μm or less.

8. The electron beam generating apparatus according to claim 6, wherein the emitter has a form not to reveal a {100} crystal plane in the emitter side surface portion on the emission side outward from a suppressor electrode, located on the side opposite the emission side of among the two electrodes establishing an electric field, and carry a negative voltage.

9. An apparatus using electron beam generating means including:
    an emitter having the conical end sharpened in the shape of a cone on the emission side of an electron beam; and
    two electrodes applying an electric filed to the conical end of the emitter,
    wherein the electric field is applied to the conical end to thereby emit electrons using a Schottky effect, so that an electron beam is generated, the electron beam generator having an improvement that a radius of curvature of the conical end is 1 μm or more to control an electron gun focal length, the apparatus further comprising:
    a processing device conducting a predetermined processing based on an electron beam generated by the electron beam generator.

10. The apparatus using electron beam generating means according to claim 9, wherein a suppressor electrode and the emitter are disposed so that a protrusion length, that is a length to the topmost point of the conical end from the suppressor electrode, is in the range of 200 μm or more and 1500 μm or less when the conical end is protruded on the emission side outward from the suppressor electrode, wherein the suppressor electrode is on the side opposite the emission side among the two electrodes establishing an electric field and carry a negative voltage, and a radius of curvature of the conical end is in the range of 1 μm or more and 4 μm or less.

11. The apparatus using electron beam generating means according to claim 9, wherein the emitter has a form not to reveal a {100} crystal plane in the emitter side surface portion on the emission side outward from the suppressor electrode, located on the side opposite the emission side among the two electrodes establishing an electric field, and carry a negative voltage.

12. The apparatus using electron beam generating means according to claim 9, wherein the apparatus is an electron probe microanalyzer conducting an analysis or observation of a specimen, and the processing device conducts an analysis or observation of a specimen by irradiating the specimen with an electron beam to obtain an X ray image based on X rays generated from the specimen, or by irradiating a specimen with an electron beam to obtain an electron beam image based on secondary electrons or reflected electrons generated from the specimen.

13. The apparatus using electron beam generating means according to claim 9, wherein the apparatus is an X ray tube, and the processing means is a target generating X rays by collision with an electron beam.

14. The apparatus using electron beam generating means according to claim 9, wherein the apparatus is an electron beam lithography apparatus, and the processing device conducts lithography using an electron beam.

15. An emitter generating an electron beam in which the conical end of an emitter on the emission side of an electron beam is sharpened in the shape of a cone and is applied with an electric field to thereby emit electrons using a Schottky effect, the emitter having an improvement that a radius of curvature of the conical end is 1 μm or more to control an electron gun focal length.

16. The emitter according to claim 15, wherein a radius of curvature of the conical end is 1 μm or more and 4 μm or less.

17. The emitter according to claim 15, which has a form not to reveal a {100} crystal plane in the emitter side surface portion.

\* \* \* \* \*